United States Patent
Wang et al.

(10) Patent No.: US 9,905,590 B2
(45) Date of Patent: Feb. 27, 2018

(54) MANUFACTURING METHOD OF A LTPS ARRAY SUBSTRATE

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Cong Wang, Guangdong (CN); Peng Du, Guangdong (CN); Xiaoxiao Wang, Guangdong (CN)

(73) Assignees: Shenzhen China Star Optoelectronics Technology Co., Ltd., Shenzhen, Guangdong (CN); Wuhan China Star Optoelectronics Technology Co., Ltd., Wuhan, Hubei (CN)

(*) Notice: Subject to any disclaimer, the term of this patent is extended or adjusted under 35 U.S.C. 154(b) by 142 days.

(21) Appl. No.: 14/779,089

(22) PCT Filed: Jul. 31, 2015

(86) PCT No.: PCT/CN2015/085660
§ 371 (c)(1),
(2) Date: Sep. 22, 2015

(87) PCT Pub. No.: WO2017/015970
PCT Pub. Date: Feb. 2, 2017

(65) Prior Publication Data
US 2017/0170203 A1 Jun. 15, 2017

(30) Foreign Application Priority Data
Jul. 24, 2015 (CN) .......................... 2015 1 0443670

(51) Int. Cl.
*H01L 27/12* (2006.01)
*H01L 29/786* (2006.01)
*G02F 1/1368* (2006.01)

(52) U.S. Cl.
CPC .......... *H01L 27/127* (2013.01); *G02F 1/1368* (2013.01); *H01L 27/1222* (2013.01);
(Continued)

(58) Field of Classification Search
CPC ... H01L 27/12; H01L 27/127; H01L 27/1222; H01L 27/1288
See application file for complete search history.

(56) References Cited

U.S. PATENT DOCUMENTS

| 6,650,389 | B1* | 11/2003 | Sakamoto | ......... G02F 1/134363 349/111 |
| 2004/0229416 | A1* | 11/2004 | Shih | ................. H01L 29/66757 438/164 |
| 2007/0077501 | A1* | 4/2007 | Nishiwaki | ............. B82Y 10/00 430/5 |

\* cited by examiner

*Primary Examiner* — Phuc Dang
(74) *Attorney, Agent, or Firm* — Andrew C. Cheng

(57) ABSTRACT

The present invention provides a LTPS array substrate and a manufacturing method thereof. The method comprises: forming a source electrode and a drain electrode on a substrate, forming polysilicon layers of a first region and a second region on the substrate including the source electrode and the drain electrode, and the thickness of the polysilicon layer of the first region is greater than the one of the second region, the polysilicon layer of the first region partially covers the source electrode and the drain electrode; passivating the surface of the polysilicon layer in order to turn the part of the adjacent surface of the polysilicon layer of the second region and the first region into an insulating layer; forming a gate electrode on the insulating layer between the source electrode and the drain electrode. The present inven- (Continued)

tion can simplify the LTPS technical process and reduce the producing costs.

11 Claims, 3 Drawing Sheets

(52) U.S. Cl.
CPC .... *H01L 27/1288* (2013.01); *H01L 29/78621* (2013.01); *H01L 29/78675* (2013.01); *G02F 2202/104* (2013.01)

MANUFACTURING METHOD OF A LTPS ARRAY SUBSTRATE

BACKGROUND OF THE INVENTION

1. Field of the Invention

The present invention relates to a display technical field, and in particular to a LTPS (Low Temperature Poly-silicon) array substrate and a manufacturing method thereof.

2. The Related Arts

Because a liquid crystal display device using LTPS technology has higher electron mobility, it can effectively reduce the thin film transistor, TFT, area to improve the aperture ratio of the pixel, and also can reduce power consumption and producing costs at the same time of enhancing the display brightness, it has become a research hotspot currently in the field of liquid crystal display. But LTPS technology is complicated, the number of layers of the array substrate adopting chemical vapor deposition, CVD, is more, resulting in numerous manufacturing processes, the producing costs can not reduce. Therefore, how to simplify the LTPS technology process is really the goal of the current enterprise.

SUMMARY OF THE INVENTION

In view of this, the embodiments of the present invention provide a LTPS array substrate and a manufacturing method thereof, in order to simplify the LTPS technology process.

An embodiment of the present invention provides a manufacturing method a LTPS array substrate, which comprises: forming a source electrode and a drain electrode of a TFT of said LTPS array substrate on a substrate; forming polysilicon layers of a first region and a second region on said substrate including said source electrode and said drain electrode, and the width of said polysilicon layer of said first region being greater than said second region, said polysilicon layer of said first region except said second region partially covering said source electrode and said drain electrode; passivating the surface of said polysilicon layer, in order to transform the portion adjacent to the surface of said polysilicon layer of said second region and said polysilicon layer of said first region into insulating layer, wherein said passivation comprises at least one of an oxidation treatment and the nitriding treatment; forming a gate electrode of said TFT on said insulating layer between said source electrode and said drain electrode; injecting P-type impurity ions into the both ends where said polysilicon layer of said first region directly contacts with said source electrode and said drain electrode, in order to form a LDD structure; forming a planar layer on said substrate including said gate electrode, and forming a contact hole in said planar layer in order to expose the surface of said drain electrode; forming a common electrode layer of said LTPS array substrate on said planar layer except for corresponding to said TFT; forming a passivation layer on said planar layer and said common electrode layer, and said passivation layer being not covered with said contact hole; forming a pixel electrode on said passivation layer, and said pixel electrode could be electrically connected with said drain electrode through said contact hole.

Wherein the substrate comprises a backing plate and a buffer layer formed on said backing plate.

Wherein said steps that forming polysilicon layers of a first region and a second region on said substrate including said source electrode and said drain electrode comprise: sequentially forming a polysilicon layer and a positive photoresist layer on said substrate including said source electrode and said drain electrode; using a half-transparent photomask to expose from the side that said substrate towards said positive photoresist layer, in order to forming the positive photoresist layers of the first region and the second region of which the thicknesses are different; removing said positive photoresist layer of the second region; etching said polysilicon layer of the second layer so that it has predetermined thickness; removing said positive photoresist layer of the first region.

Another embodiment of the present invention provides a manufacturing method of a LTPS array substrate, which comprises: forming a source electrode and a drain electrode of a TFT of said LTPS array substrate on a substrate; forming polysilicon layers of a first region and a second region on said substrate including said source electrode and said drain electrode, and the width of said polysilicon layer of said first region being greater than said second region, said polysilicon layer of said first region except said second region partially covering said source electrode and said drain electrode; passivating the surface of said polysilicon layer, in order to transform the portion adjacent to the surface of said polysilicon layer of said second region and said polysilicon layer of said first region into insulating layer; forming a gate electrode of said TFT on said insulating layer between said source electrode and said drain electrode.

Wherein the substrate comprises a backing plate and a buffer layer formed on said backing plate.

Wherein said steps that forming polysilicon layers of a first region and a second region on said substrate including said source electrode and said drain electrode comprise: sequentially forming a polysilicon layer and a positive photoresist layer on said substrate including said source electrode and said drain electrode; using a half-transparent photomask to expose from the side that said substrate towards said positive photoresist layer, in order to forming the positive photoresist layers of the first region and the second region of which the thicknesses are different; removing said positive photoresist layer of the second region; etching said polysilicon layer of the second layer so that it has predetermined thickness; removing said positive photoresist layer of the first region.

Wherein said passivation comprises at least one of an oxidation treatment and the nitriding treatment.

Wherein after forming said gate electrode on said insulating layer between said source electrode and said drain electrode, said method further comprises: injecting first impurity ions into the both ends where said polysilicon layer of said first region directly contacts with said source electrode and said drain electrode; injecting second impurity ions into said polysilicon layer of said first region corresponding to where are between said gate electrode and said source electrode as well as said gate electrode and said drain electrode, in order to form a LDD structure.

Wherein after forming said LDD structure, said method further comprises: forming a planar layer on said substrate including said gate electrode, and forming a contact hole in said planar layer in order to expose the surface of said drain electrode; forming a common electrode layer of said LTPS array substrate on said planar layer except for corresponding to said TFT; forming a passivation layer on said planar layer and said common electrode layer, and said passivation layer being not covered with said contact hole; forming a pixel electrode on said passivation layer, and said pixel electrode could be electrically connected with said drain electrode through said contact hole.

Wherein said first impurity ion is a N+ type impurity ion, and said second impurity ion is a N− type impurity ion.

Wherein after forming said gate electrode on said insulating layer between said source electrode and said drain electrode, said method further comprises: injecting P-type impurity ions into the both ends where said polysilicon layer of said first region directly contacts with said source electrode and said drain electrode, in order to form a LDD structure.

Wherein after forming said LDD structure, said method further comprises: forming a planar layer on said substrate including said gate electrode, and forming a contact hole in said planar layer in order to expose the surface of said drain electrode; forming a common electrode layer of said LTPS array substrate on said planar layer except for corresponding to said TFT; forming a passivation layer on said planar layer and said common electrode, and said passivation layer being not covered with said contact hole; forming a pixel electrode on said passivation layer, and said pixel electrode could be electrically connected with said drain electrode through said contact hole.

The other embodiment of the present invention provides a LTPS array substrate, which comprises: a substrate; a source electrode and a drain electrode, which are located on said substrate; a polysilicon layer, which is located on said substrate including said source electrode and said drain electrode, and said polysilicon layer partially covering said source electrode and said drain electrode; an insulating layer, which is located on said polysilicon layer as well as said source electrode and said drain electrode, and said insulating layer being obtained by passivation of said polysilicon layer covering on said substrate including said source electrode and said drain electrode; a gate electrode, which is located on said insulating layer between said source electrode and said drain electrode; a planar layer, which is located on said substrate including said gate electrode, and inside said planar layer forming a contact hole exposing the surface of said drain electrode; a common electrode, which is located on said planar layer except TFT corresponding to said LTPS array substrate; a passivation layer, which is located on said planar layer and said common electrode layer, and said passivation layer does not cover said contact hole; a pixel electrode, which is located on said passivation layer, and said pixel electrode could be electrically connected with said drain electrode through said contact hole.

Wherein said passivation comprises at least one of an oxidation treatment and the nitriding treatment.

The LTPS array substrate and the manufacturing method thereof in the embodiments of the present invention, through the way passivating the surface of the polysilicon layer, there is no need to adopt CVD technology to obtain the insulating layer between the gate electrode and the source electrode as well as the drain electrode, comparing to LTPS technology process and reduce the producing costs.

DETAILED DESCRIPTION OF THE PREFERRED EMBODIMENTS

The following will combine the drawings of the embodiment of the present invention to clearly and completely describe the technical solution of the exemplary embodiments provided by the present invention.

Figure 1:
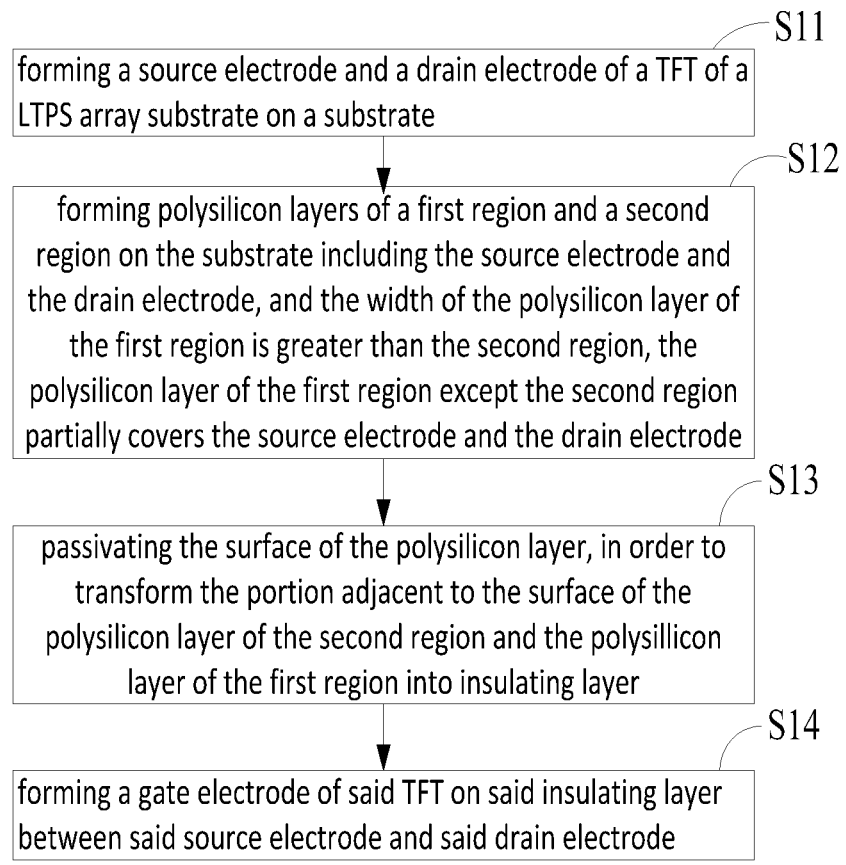
FIG. 1 is a flow chart of a manufacturing method of a LTPS array substrate of an embodiment of the present invention.

FIG. 1 is a flow chart of a manufacturing method of a LTPS array substrate of an embodiment of the present invention. As shown in FIG. 1, the manufacturing method of the present invention comprises the following steps:

Step 11: forming a source electrode and a drain electrode of a TFT of said LTPS array substrate on a substrate.

Figure 2:
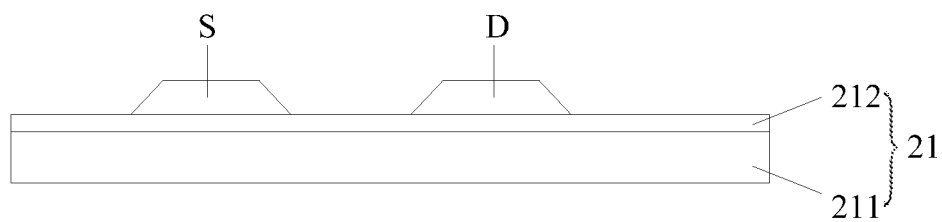
FIG. 2 is a schematic diagram of forming a source electrode and a drain electrode of a manufacturing method of the present invention.

The substrate is used to form a LTPS array substrate of the liquid crystal display panel, which could be a glass substrate, a plastic substrate or a flexible substrate. As shown in FIG. 2, the substrate 21 could also comprise a backing plate 211 and a transparent buffer layer 212 forming on the backing plate 211. Wherein the buffer layer 212 is SiNx layer, SiOx layer or the combination of both, the buffer layer 212 is used to prevent that the impurities within the backing plate 211 diffuses upward in the subsequent process and affect the quality of the formed low-temperature polysilicon thin film, the SiNx layer and the SiOx layer could be formed by adopting CVD technology or plasma enhanced chemical vapor deposition, PECVD, technology, it may also adopt the methods such as sputtering, vacuum deposition or low pressure chemical vapor deposition and so on, but is not limited by these.

The present embodiment can use the first photo mask to expose the first metal layer forming on the substrate 21, and carrying out development and etching such patterned process after the exposure in order to form the source electrode S and the drain electrode D, which can use the etching liquid comprising phosphoric acid, nitric acid, acetic acid and deionized water to etch the first metal layer; certainly, it can also use the dry etching. Wherein, metals such as aluminum, molybdenum, titanium, chromium, copper, or metal oxides such as titanium oxide, metal alloy or other conductive material could compose said first metal layer.

Certainly, the present embodiment could also obtain the source electrode S and the drain electrode D of the TDT through the other ways, such as adopting CVD technology, PECVD technology, sputtering, vacuum deposition or low pressure chemical vapor deposition and so on to directly form the source electrode S and the drain electrode D having a predetermined pattern on the substrate 21.

Step 12: forming polysilicon layers of a first region and a second region on said substrate including said source electrode and said drain electrode, and the width of said polysilicon layer of said first region being greater than said second region, said polysilicon layer of said first region except said second region partially covering said source electrode and said drain electrode.

Figure 3:
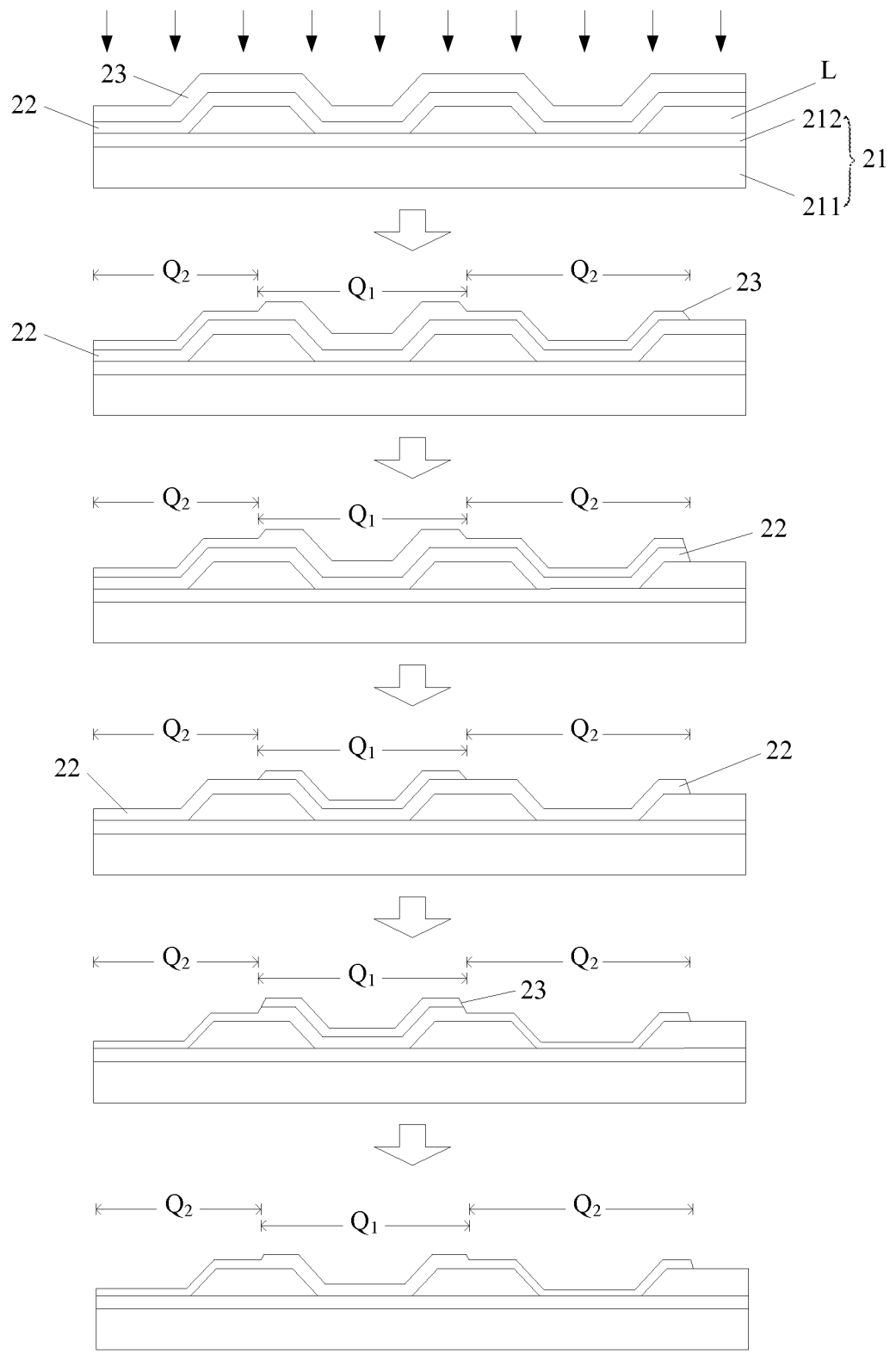
FIG. 3 is a schematic diagram of forming a polysilicon layer of a manufacturing method of the present invention.

Combining with FIG. 3, the specific process of forming the polysilicon layer 22 of the first region $Q_1$ and the polysilicon layer 22 of the second region $Q_2$ comprises but is not limited:

First, forming a semiconductor layer on the substrate 21 including the source electrode S and the drain electrode D, the semiconductor does not only cover the source electrode S and the drain electrode D as well as the metal trace L, but also cover the whole upper surface of the substrate 21, and then adopting excimer laser annealing, ELA, technology to the semiconductor to obtain a whole surface of the polysilicon layer 22, in the meantime, the polysilicon layer 22 does not only cover the source electrode S and the drain electrode D, but also cover the whole upper surface of the substrate 21, and then forming a positive photoresist layer 23 on the polysilicon layer 22.

Afterward, using a half-tone mask and exposing from the substrate 21 towards the side (as arrow shown in the figure) of positive photoresist layer 23, the exposure intensity of the positive photoresist layer 23 of the first region $Q_1$ is greater than the exposure intensity of the second region $Q_2$, thereby making the positive photoresist layer 23 that is originally uniform thickness become the positive photoresist layer 23 of which the thickness is different.

Next, carrying out development to the exposed positive photoresist layer 23. In this step, the present embodiment could eliminate a part of positive photoresist layer 23 on the top of metal trace L through development in order to expose the polysilicon layer 22 on the bottom thereof, and eliminate a part of the polysilicon layer 22 on the top of the metal trace L through etching process in order to expose the metal trace L on the bottom thereof, the metal trace L is used to achieve the connection between the TFT and the signal lines such as the scan line, the data line and so on of the LTPS array substrate.

Then, eliminating the positive photoresist layer 23 of the second region $Q_2$ through ashing process, the thickness of the polysilicon layer 22 after the ashing process is less than the thickness before the ashing process. The present step can eliminate the positive photoresist 23 of the second region $Q_2$ without using the photo mask, thereby exposing the polysilicon layer 22 corresponding to the second region $Q_2$, comparing to the prior art, the present embodiment can reduce the amount of the photo mask of the LTPS technology.

Furthermore, carrying out the etching process to the exposed polysilicon layer corresponding to the second region $Q_2$, in order to reduce the thickness thereof to the predetermined thickness of producing requirement.

Finally, eliminating the positive photoresist layer 23 of the first region $Q_1$.

Step 13: carrying out the passivation to the surface of the polysilicon layer, in order to turn the adjacent surfaces of the polysilicon layers of the second region and the first region into the insulating layers.

Figure 4:
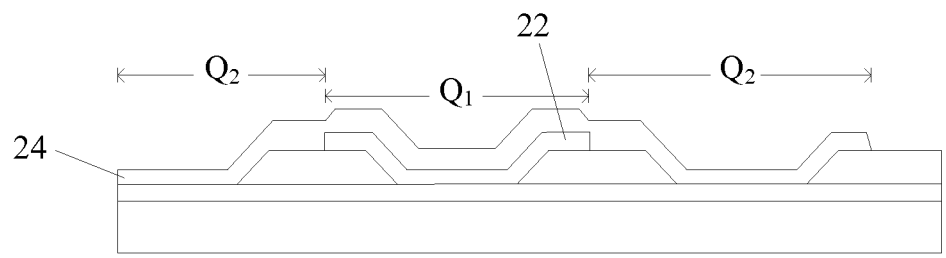
FIG. 4 is a schematic diagram of forming an insulating layer of a manufacturing method of the present invention.

Combining FIG. 4, the passivation could be oxidation treatment, specifically, carrying out the oxidation treatment to the surface of the polysilicon layer 22 of the first region $Q_1$ and the second region $Q_2$ through adopting $O_2$ plasma in order to generate $SiO_x$, so that whole the polysilicon layer 22 of the first region $Q_1$ becomes $SiO_x$, and the upper half-layer of the polysilicon layer 22 of the second region $Q_2$ becomes $SiO_x$, the lower half-layer will not become $SiO_x$ because of the shielding of the upper half-layer, it is still the polysilicon layer 22. As an insulating layer 24, commonly known as a gate-insulating layer, comparing to the traditional CVD technology, the passivation is much easier, thereby it can simplify the whole process of the LTPS technology and reduce the producing costs.

The passivation could be nitriding treatment, making whole the polysilicon layer 22 of first region $Q_1$ become $SiN_x$, and making the upper half-layer of the polysilicon layer 22 of the second region $Q_2$ become $SiN_x$, the lower half-layer is still the polysilicon layer 22, $SiN_x$ is nitride formed as the insulating layer 24. Certainly, the passivation also could be the combination of the oxidation treatment and the nitriding treatment.

Step 14: forming a gate electrode of TFT on the insulating layer between the source electrode and the drain electrode.

Figure 5:
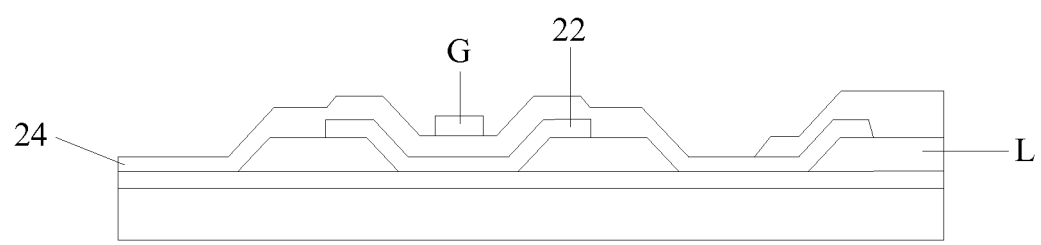
FIG. 5 is a schematic diagram of forming a gate electrode of a manufacturing method of the present invention.

Combing FIG. 5, the present embodiment can expose the second metal layer on the insulating layer 24 forming between the source electrode S and the drain electrode D through using the second photo mask, and carrying out development, etching such patterning process after exposing in order to obtain the gate electrode G, which can use the etching liquid comprising phosphoric acid, nitric acid, acetic acid and deionized water to etch the second metal layer, it can also use the dry etching, certainly, it also can adopt CVD technology, PECVD technology, sputtering, vacuum deposition or low pressure chemical vapor deposition such methods to directly forming the gate electrode G having the predetermined pattern on the insulating layer 24.

Wherein a metal layer is formed on the top of the metal trace L at the same time of forming the gate electrode G, thereby making the metal trace L able to electrically connect with the subsequently formed common electrode.

After forming the gate electrode, the present embodiment further subjects to doping treatment to the polysilicon layer 22 in order to make TFT have lightly doped drain, LDD, structure. Specifically, injecting first impurity ions into the both ends where said polysilicon layer 22 of said first region $Q_1$ directly contacts with said source electrode S and said drain electrode D, namely, carrying out heavily doping process in the traditional sense to the polysilicon layer 22 of the first region $Q_1$, thereby it can achieve the ohmic contact between the source S electrode as well as the drain electrode D and the polysilicon layer 22 of the first region $Q_1$, and then etching the gate electrode G in order to reduce the thickness thereof and expose the polysilicon layer 22 below corresponding to where are between the gate electrode G and the source electrode S as well as the gate electrode G and the drain electrode D, injecting second impurity ions into said polysilicon layer 22 of said first region $Q_1$ corresponding to where are between said gate electrode G and said source electrode S as well as said gate electrode G and said drain electrode D, namely, carrying out lightly doping process in the traditional sense to the polysilicon layer 22 of the first region $Q_1$, thereby forming a LDD structure.

The first impurity ion could be N+ type impurity ion, correspondingly, the second impurity ion could be N− type impurity ion, but there is no need to dope the second impurity ions when the first impurity ion is P+ type impurity ion, namely, the step of the lightly doping process is omitted.

Figure 6:
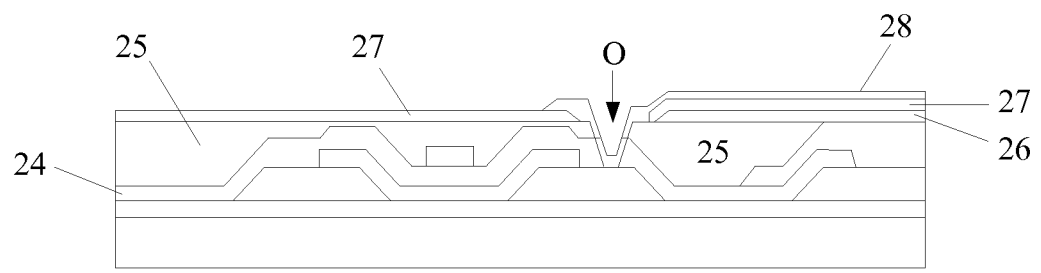
FIG. 6 is a schematic diagram of forming a pixel electrode of a manufacturing method of the present invention.

As shown in FIG. 6, the manufacturing method of the embodiment of the present invention also comprises the following steps:

Providing a contact hole O in the insulating layer 24 in order to expose the surface of the drain electrode D.

Forming a planar layer 25 on the substrate 21 including the gate electrode G, and forming a contact hole O in the planar layer 25 in order to expose the surface of the drain electrode D. Wherein, the present embodiment could use the third photo mask to obtain the contact hole O through the exposure, the development process and the etching process.

Forming a common electrode layer 26 of the LTPS array substrate on the planar layer 25 except for corresponding to the TFT. Wherein the present embodiment can use the fourth photo mask to obtain a common electrode layer 26 having the predetermined pattern through the exposure, the development process and the etching process.

Forming a passivation layer 27 on the planar 25 and the common electrode layer 26, and the passivation layer 27 does not cover the contact hole O. Wherein the present embodiment can use the fifth photo mask to obtain a passivation layer 27 having the predetermined pattern through the exposure, the development process and the etching process. Certainly, the present embodiment can also use the chemical vapor deposition, the plasma chemical vapor deposition, the sputtering, the vacuum vapor deposition or the low pressure chemical vapor deposition and so on such methods to directly form a passivation layer 27 having the predetermined pattern.

Forming a pixel electrode 28 on the passivation layer 27, and the pixel electrode 28 could be electrically connected with the drain electrode D through the contact hole O. Wherein the present embodiment can use the sixth photo mask to obtain the pixel electrode 28 having the predetermined pattern through the exposure, the development process and the etching process. Otherwise, the gate electrode G of the TFT is electrically connected with the gate line forming on the substrate 21 (LTPS array substrate), the source electrode S of the TFT is electrically connected with the data line forming on the LTPS array substrate, the gate line and the data line intersect perpendicularly to form the pixel display area where the pixel electrode 28 is.

The embodiment of the present invention further provides a liquid crystal display panel and a liquid crystal display which have the LTPS array substrate as shown in FIG. 6, which have the same benefits.

Based on this, the preferred embodiments according to the present invention are mentioned above, which cannot be used to define the scope of the right of the present invention. Those variations of equivalent structure or equivalent process according to the present specification and the drawings or directly or indirectly applied in other areas of technology are considered encompassed in the scope of protection defined by the claims of the present invention.

What is claimed is:

1. A manufacturing method of a LTPS array substrate, wherein it comprises:
    forming a source electrode and a drain electrode of a TFT of said LTPS array substrate on a substrate;
    forming polysilicon layers of a first region and a second region on said substrate including said source electrode and said drain electrode, and the width of said polysilicon layer of said first region being greater than said second region, said polysilicon layer of said first region except said second region partially covering said source electrode and said drain electrode;
    passivating the surface of said polysilicon layer, in order to transform the portion adjacent to the surface of said polysilicon layer of said second region and said polysillicon layer of said first region into insulating layer, wherein said passivation comprises at least one of an oxidation treatment and the nitriding treatment;
    forming a gate electrode of said TFT on said insulating layer between said source electrode and said drain electrode;
    injecting P-type impurity ions into the both ends where said polysilicon layer of said first region directly contacts with said source electrode and said drain electrode, in order to form a LDD structure;
    forming a planar layer on said substrate including said gate electrode, and forming a contact hole in said planar layer in order to expose the surface of said drain electrode;
    forming a common electrode layer of said LTPS array substrate on said planar layer except for corresponding to said TFT;
    forming a passivation layer on said planar layer and said common electrode, and said passivation layer being not covered with said contact hole;
    forming a pixel electrode on said passivation layer, and said pixel electrode could be electrically connected with said drain electrode through said contact hole.

2. The method as claimed in claim 1, wherein the substrate comprises a backing plate and a buffer layer formed on said backing plate.

3. The method as claimed in claim 1, wherein said steps that forming polysilicon layers of a first region and a second region on said substrate including said source electrode and said drain electrode comprise:
    sequentially forming a polysilicon layer and a positive photoresist layer on said substrate including said source electrode and said drain electrode;
    using a half-transparent photomask to expose from the side that said substrate towards said positive photoresist layer, in order to forming the positive photoresist layers of the first region and the second region of which the thicknesses are different;
    removing said positive photoresist layer of the second region;
    etching said polysilicon layer of the second layer so that it has predetermined thickness;
    removing said positive photoresist layer of the first region.

4. A manufacturing method of a LTPS array substrate, wherein it comprises:
    forming a source electrode and a drain electrode of a TFT of said LTPS array substrate on a substrate;
    forming polysilicon layers of a first region and a second region on said substrate including said source electrode and said drain electrode, and the width of said polysilicon layer of said first region being greater than said second region, said polysilicon layer of said first region except said second region partially covering said source electrode and said drain electrode;
    passivating the surface of said polysilicon layer, in order to transform the portion adjacent to the surface of said polysilicon layer of said second region and said polysillicon layer of said first region into insulating layer;
    forming a gate electrode of said TFT on said insulating layer between said source electrode and said drain electrode; and
    wherein the substrate comprises a backing plate and a buffer layer formed on said backing plate.

5. The method as claimed in claim 4, wherein said steps that forming polysilicon layers of a first region and a second region on said substrate including said source electrode and said drain electrode comprise:
    sequentially forming a polysilicon layer and a positive photoresist layer on said substrate including said source electrode and said drain electrode;
    using a half-transparent photomask to expose from the side that said substrate towards said positive photoresist layer, in order to forming the positive photoresist layers of the first region and the second region of which the thicknesses are different;
    removing said positive photoresist layer of the second region;
    etching said polysilicon layer of the second layer so that it has predetermined thickness;

removing said positive photoresist layer of the first region.

6. The method as claimed in claim 4, wherein said passivation comprises at least one of an oxidation treatment and the nitriding treatment.

7. The method as claimed in claim 4, wherein after forming said gate electrode on said insulating layer between said source electrode and said drain electrode, said method further comprises:
   injecting P-type impurity ions into the both ends where said polysilicon layer of said first region directly contacts with said source electrode and said drain electrode, in order to form a LDD structure.

8. The method as claimed in claim 7, wherein after forming said LDD structure, said method further comprises:
   forming a planar layer on said substrate including said gate electrode, and forming a contact hole in said planar layer in order to expose the surface of said drain electrode;
   forming a common electrode layer of said LTPS array substrate on said planar layer except for corresponding to said TFT;
   forming a passivation layer on said planar layer and said common electrode, and said passivation layer being not covered with said contact hole;
   forming a pixel electrode on said passivation layer, and said pixel electrode could be electrically connected with said drain electrode through said contact hole.

9. A manufacturing method of a LTPS array substrate, comprising:
   forming a source electrode and a drain electrode of a TFT of said LTPS array substrate on a substrate;
   forming polysilicon layers of a first region and a second region on said substrate including said source electrode and said drain electrode, and the width of said polysilicon layer of said first region being greater than said second region, said polysilicon layer of said first region except said second region partially covering said source electrode and said drain electrode;
   passivating the surface of said polysilicon layer in order to transform the portion adjacent to the surface of said polysilicon layer of said second region and said polysillicon layer of said first region into insulating layer;
   forming a gate electrode of said TFT on said insulating layer between said source electrode and said drain electrode;
   wherein after forming said gate electrode on said insulating layer between said source electrode and said drain electrode, further comprising,
   injecting first impurity ions into the both ends where said polysilicon layer of said first region directly contacts with said source electrode and said drain electrode; and
   injecting second impurity ions into said polysilicon layer of said first region corresponding to where are between said gate electrode and said source electrode as well as said gate electrode and said drain electrode, in order to form a LDD structure.

10. The method as claimed in claim 9, wherein after forming said LDD structure, said method further comprises:
   forming a planar layer on said substrate including said gate electrode, and forming a contact hole in said planar layer in order to expose the surface of said drain electrode;
   forming a common electrode layer of said LTPS array substrate on said planar layer except for corresponding to said TFT;
   forming a passivation layer on said planar layer and said common electrode, and said passivation layer being not covered with said contact hole;
   forming a pixel electrode on said passivation layer, and said pixel electrode could be electrically connected with said drain electrode through said contact hole.

11. The method as claimed in claim 9, wherein said first impurity ion is a N+ type impurity ion, and said second impurity ion is a N− type impurity ion.

\* \* \* \* \*